United States Patent
Mazingue-Desailly et al.

(10) Patent No.: US 8,328,580 B2
(45) Date of Patent: Dec. 11, 2012

(54) DEVICE FOR SECURING A POST IN A TERMINAL CLAMP

(75) Inventors: Stephan Mazingue-Desailly, Ludwigsburg (DE); Roland Hellwig, Schwieberdingen (DE); Michael Mueller, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/201,523

(22) PCT Filed: Dec. 17, 2009

(86) PCT No.: PCT/EP2009/067415
§ 371 (c)(1),
(2), (4) Date: Oct. 26, 2011

(87) PCT Pub. No.: WO2010/091762
PCT Pub. Date: Aug. 19, 2010

(65) Prior Publication Data
US 2012/0164883 A1  Jun. 28, 2012

(30) Foreign Application Priority Data
Feb. 13, 2009  (DE) .......... 10 2009 000 828

(51) Int. Cl.
*H01R 13/66* (2006.01)
(52) U.S. Cl. .......... 439/620.01; 439/504; 439/762

(58) Field of Classification Search .......... 439/504, 439/620.01, 762
See application file for complete search history.

(56) References Cited

U.S. PATENT DOCUMENTS

| | | | |
|---|---|---|---|
| 7,965,075 B2 * | 6/2011 | Mueller et al. | 324/207.25 |
| 2010/0210153 A1 * | 8/2010 | Mazingue-Desailly et al. | 439/877 |
| 2012/0164883 A1 * | 6/2012 | Mazingue-Desailly et al. | 439/620.01 |

FOREIGN PATENT DOCUMENTS

| DE | 102004037874 | 2/2006 |
|---|---|---|
| DE | 102004046855 | 4/2006 |

OTHER PUBLICATIONS

International Search Report for PCT/EP2009/067415, dated Mar. 18, 2010.

* cited by examiner

*Primary Examiner* — James Harvey
(74) *Attorney, Agent, or Firm* — Kenyon & Kenyon LLP

(57) ABSTRACT

A device is proposed for fastening a post in a terminal clamp, having at least one terminal clamp for connection to a battery terminal, at least one electronics unit or measuring element capable of being connected to the terminal clamp, at least one post for connecting a battery cable, the post being mechanically fastened to the terminal clamp via a connection, and having at least one insulating element between the post and the terminal clamp, means being provided for the rotational securing of the post.

13 Claims, 4 Drawing Sheets

DEVICE FOR SECURING A POST IN A TERMINAL CLAMP

FIELD OF THE INVENTION

The present invention relates to a device for fastening a post in a terminal clamp.

BACKGROUND

The present invention is based on a device for fastening a post in a terminal clamp of the type described herein. A device of this type is known from German Patent DE 10 2004 046 855 B3. In order to fasten a measuring resistor to the terminal clamp and to fasten one end of a ground wire to the measuring resistor, a post is known having an insulating sheath, the post being connected to the measuring resistor by a press-fit connection or rivet connection.

The object of the present invention is to simplify the connection between the post and the terminal clamp while achieving a high degree of mechanical strength. This object is achieved by the features of the present invention described herein.

SUMMARY

In comparison with the prior art, the device according to the present invention having the features described herein has the advantage that it increases mechanical strength without relying on a rivet connection or press-fit connection. This is achieved in that means are provided for rotationally securing the post. In particular, these means absorb forces that would cause a rotation of the post. In this way, tensile forces on the battery cable are dissipated via the terminal clamp. The proposed solution can also be realized as a preassembled terminal clamp having a post. Via the post, a mechanical bond to the terminal clamp is achieved in a simple manner, with simultaneous electrical insulation.

In a useful development, as a means for rotational securing a receptacle is provided in the terminal clamp that cooperates with a receptacle contour. This receptacle contour is preferably star-shaped or rectangular, so that corresponding forces can be uniformly absorbed.

In a useful development, the insulating element is made of a flexible material, preferably plastic or silicone. This enables a simple joining of the post to the insulating element, the terminal clamp, and, if present, the measuring element, with tolerance compensation if required.

In a useful development, the insulating element is formed as an injection-molded part. This may be sprayed directly onto the terminal clamp and the post, so that these parts are molded together to form a unit. In this way, a joining process may be omitted. In addition, the precision of the positioning of the post in the terminal clamp is increased.

In a useful development, the insulating element is made up of a coating of the post, preferably an insulating lacquer or some other material that electrically insulates the surface of the post. The post is subsequently mounted in the terminal clamp, for example by pressing the post into the terminal clamp.

In a useful development, the post is provided with a preferably circumferential collar for the at least partial accommodation of the measuring element. In this way, the post simultaneously acts as a mechanical support surface for the measuring element, thus increasing the mechanical strength of the system. Here the outer diameter of the collar is usefully smaller than the outer diameter of the insulating element. This achieves a reliable electrical insulation between the terminal clamp and the post.

Further useful aspects of the present result from the description herein. In this regard, a plurality of exemplary embodiments of the device for fastening a post in a terminal clamp are shown in the drawings and are described in more detail below.

DETAILED DESCRIPTION

Figure 1:
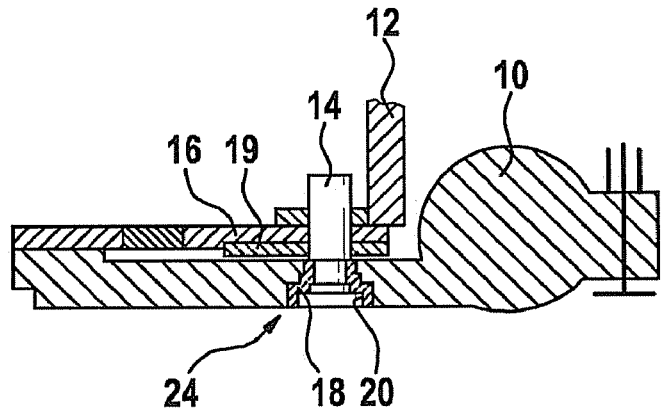
FIG. 1 shows a schematic representation of the overall assembly, having an insulated post situated in a terminal clamp.

A schematically shown terminal clamp 10 has a receptacle 20 in which a post 14, surrounded in its lower area by an insulating element 18, is situated so as to be electrically insulated from terminal clamp 10. This post 14 contacts a measuring element 16 in an electrically conductive manner. Below the underside of measuring element 16, in the area of receptacle 20 there may be situated an insulation 19, in order to ensure that at this location in particular there is no electrically conductive contact between measuring element 16 and terminal clamp 10. This insulation 19 may also be a component of insulating element 18. Via post 14, a battery cable 12 is connected electrically and mechanically to terminal clamp 10.

Figure 2:
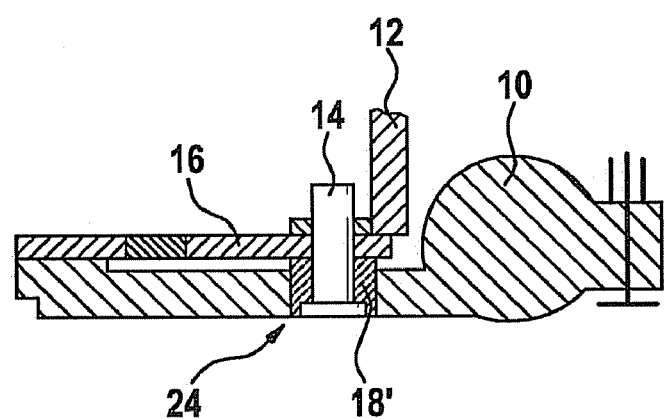
FIG. 2 shows a second exemplary embodiment having an insulating element formed by molding.

The exemplary embodiment shown in FIG. 2 differs from that shown in FIG. 1 only in that it has a different embodiment of insulating element 18. This element is formed as an injection-molded part in such a way that both terminal clamp 10 and post 14 are molded to form a unit. Here the underside of measuring element 16 is situated on the upper side of insulating element 18.

Post 14 is used to fasten battery cable 12. For this purpose, for example a threading (not shown) is provided. The cable shoe of battery cable 12 is placed around post 14 and is subsequently fastened by a nut. Measuring element 16, which is preferably formed so as to be flat, is also placed around this post 14. Post 14 is in turn mechanically connected to terminal clamp 10 via insulating element 18, by a suitable connection 24. In the exemplary embodiment shown in FIG. 1, for example, insulating element 18 is formed as a sheath-shaped element. For this purpose, insulating element 18 must have sufficient flexibility to allow post 14 and terminal clamp 10 to be joined. The flexibility of insulating element 18 also provides tolerance compensation. Latch mechanisms may also be used to ensure that post 14 is securely positioned in terminal clamp 10. The material of insulating element 18 is preferably a plastic or an elastomer (for example silicone). In the exemplary embodiment shown in FIG. 2, insulating element 18 is realized as an injection-molded part. For this purpose, post 14 and terminal clamp 10 (positioned at a distance from one another) are molded with an insulating plastic, resulting in insulating element 18. Preferably, the upper edge of insulating element 18 extends somewhat past the upper side of terminal clamp 10, so that it is ensured that measuring element 16 is situated so as to be electrically insulated from terminal clamp 10 at the location of post 14.

Figure 3:
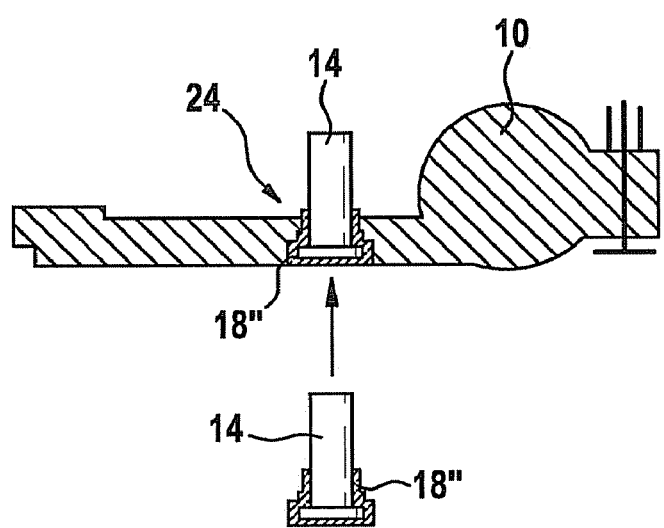
FIG. 3 shows a further exemplary embodiment having a coated post.

In the exemplary embodiment shown in FIG. 3, post 14 is provided in its lower region with a coating 18". In the region that is to be insulated, post 14 is provided with a lacquer or with some other suitable insulating surface. Post 14 coated in this way is subsequently mounted in terminal clamp 10, for example pressed in.

Figure 4:
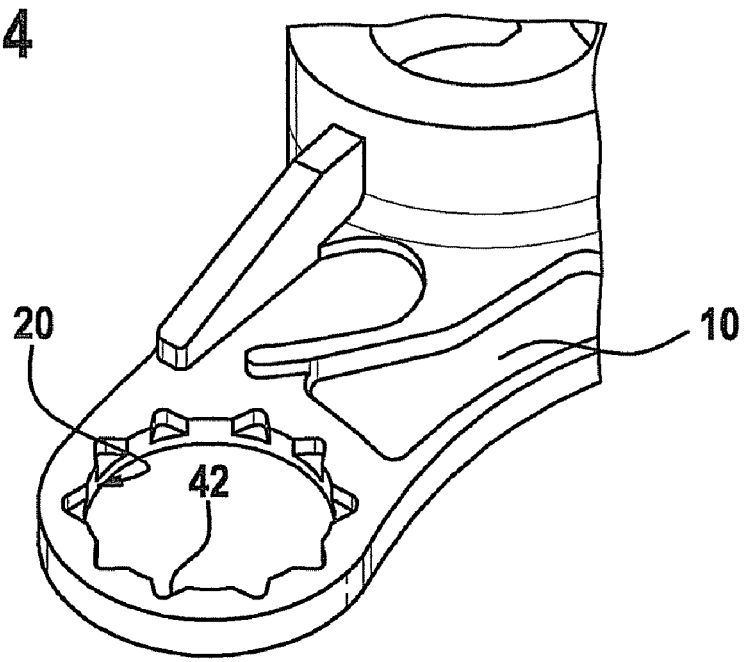
FIG. 4 shows a detail view of the terminal clamp for accommodating the post.
Figure 5:
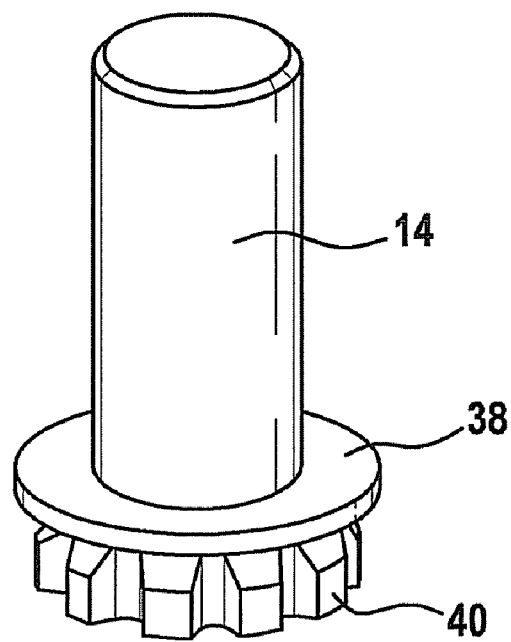
FIG. 5 shows the post of FIG. 4.
Figure 6:
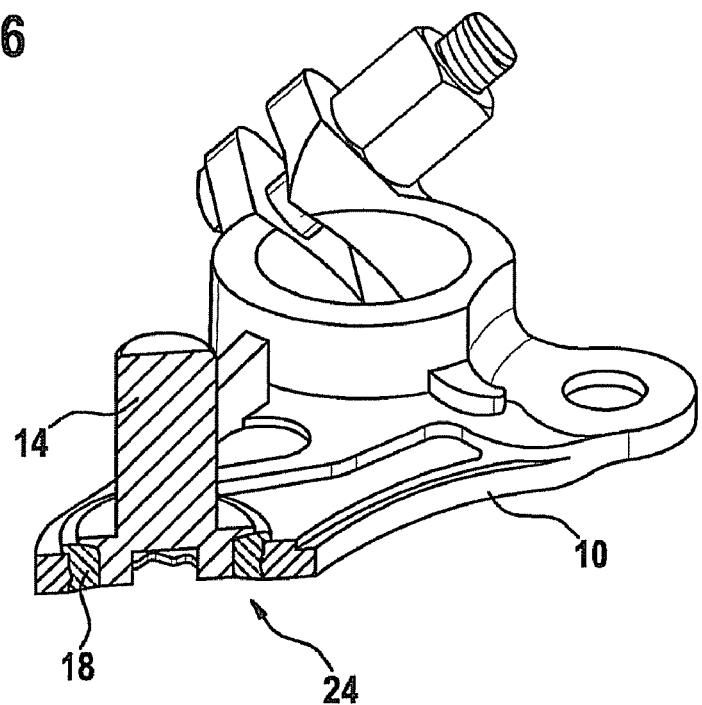
FIG. 6 shows a partially sectional perspective view of the connection between the terminal clamp and the post.

FIG. 4 shows receptacle 20 of terminal clamp 10 in more detail. An essentially star-shaped receptacle contour 14 can be seen that is formed in such a way that rotation of post 14 on the one hand, as well as movement of post 14 downward in the axial direction, is reliably prevented. The associated post 14 is shown in FIG. 5. Correspondingly, the post 14 also has a fastening contour 40 that is star-shaped. Above fastening contour 40, a radially circumferential collar 38 is provided. The outer diameter of collar 38 is preferably larger than that of fastening contour 40. The components shown in FIGS. 4 and 5 are shown in the assembled state in FIG. 6. Insulating element 18 is formed in such a way that an electrical insulation is achieved between terminal clamp 10 and post 14. In addition, the outer radius of the upper side of insulating element 18 is greater than the outer radius of collar 38. This reliably achieves an insulation between terminal clamp 10 and post 14.

In order to prevent rotation, receptacle contour 42 may, for example, be made rectangular, prismatic, triangular, or roughly rectangular, having one or two rounded-off side surfaces. Advantageously, receptacle contour 42 may have counter-surfaces in a plane perpendicular to the axial direction of post 14, so that post 14 may be mounted in a defined axial position, or receptacle contour 48 may also absorb forces acting in the axial direction.

Figure 7:
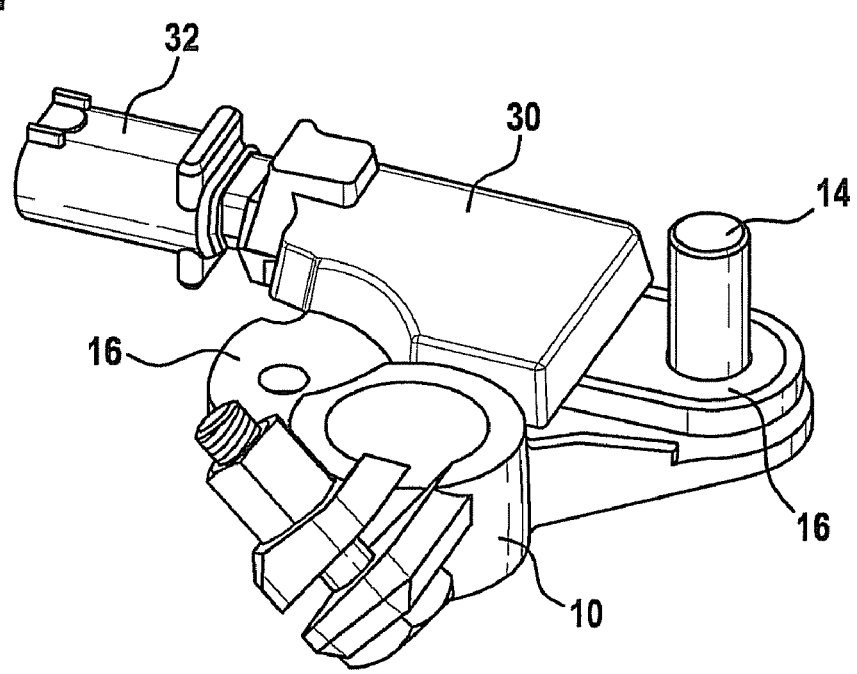
FIG. 7 shows a perspective view of a battery measuring clamp having a post integrated in the terminal clamp.
Figure 8:
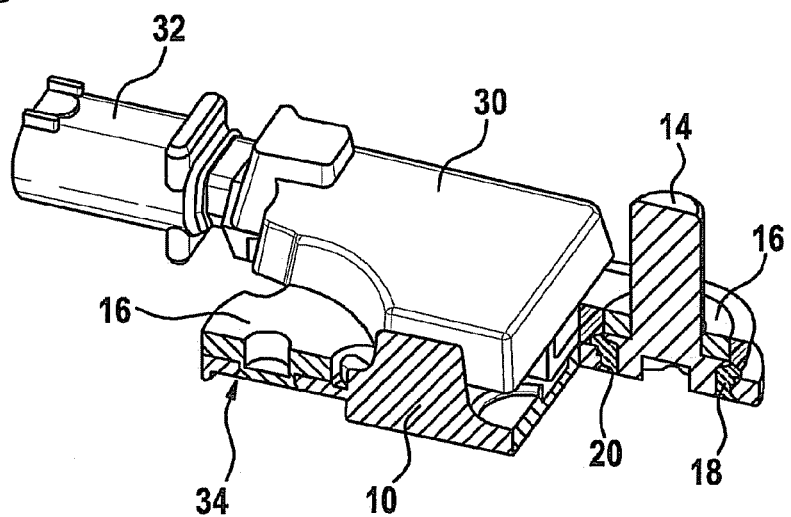
FIG. 8 shows a perspective view corresponding to FIG. 7 in partial section.

In the exemplary embodiment according to FIG. 7, terminal clamp 10 is shown, which may be connected to a terminal (not shown) of a battery, for example a battery of a motor vehicle. For this purpose, the limbs (not shown in more detail) of terminal clamp 10 can be moved towards one another in such a way that they clasp the battery terminal. The system also includes measuring element 16. Measuring element 16 is immediately connected mechanically and electrically to terminal clamp 10 on the one side by a compression 34 using clinching. At the location of compression 34, terminal clamp 10 has an opening having chamfering on its rear side. The terminal of measuring element 16 is pressed into this opening using clinching in such a way that an undercut of measuring element 16 is formed in the area of the chamfering. This creates a quasi-riveted connection of terminal clamp 10 to measuring element 16.

On the right side, receptacle 20 of terminal clamp 10 is shown, which is used to fasten post 14. For this purpose, post 14 is, for example, made cylindrical, and extends upwardly perpendicular to the flat plane of measuring element 16. Insulating element 18 is situated between post 14 and terminal clamp 10, radially surrounding post 14. The depicted system ensures that the battery current between post 14 for connecting battery cable 12 and the clamp connected to the battery terminal actually flows via measuring element 16 and is not short-circuited. A corresponding opening in measuring element 16 is matched to the outer diameter of post 14. Measuring element 16 lies partly on radially expanding collar 38 on post 14, and partly also on the upper side of insulating element 18, which is formed as a sheath. The upward-protruding side of post 14 may be provided with a threading (not shown) in order to fasten a cable shoe of a battery cable 12, preferably the ground cable, using screwed connections. In the region of post 14, measuring element 16 is surrounded by a housing 30 only laterally, while the surface of measuring element 16 is exposed.

Measuring element 16 is guided in the direction of housing 30, into its interior. The actual measuring element is situated there, for example an electrical resistor made of a particular material such as manganin. Inside housing 30 there is also situated an electronics unit (not shown) that detects the voltage drop at measuring resistor 16 and further evaluates it. In addition, on the basis of further data such as battery voltage, temperature, or the like, battery state quantities such as state of charge (SOC) or aging (state of health: SOH) can be determined. These data can be forwarded to further control devices, such as an energy management control device, via a data line (not shown) connected via a plug 32. The additional supply voltage can also be supplied via this plug 32.

Measuring element 16 is led out from housing 30 at the side facing away from post 14. The electrical contacting to terminal clamp 10 also takes place at this location, in a compression 34 preferably obtained by clinching. However, it is essential that the electrical contacting between measuring element 16 and terminal clamp 10 should first take place, relative to the actual measuring resistor, at the side facing away from post 14. In this way, the current from the battery terminal is conducted via terminal clamp 10, the connection at the left connecting point of measuring element 16, and the measuring resistor situated inside housing 30, to post 14, to which battery cable 12 is then to be connected.

Figure 9:
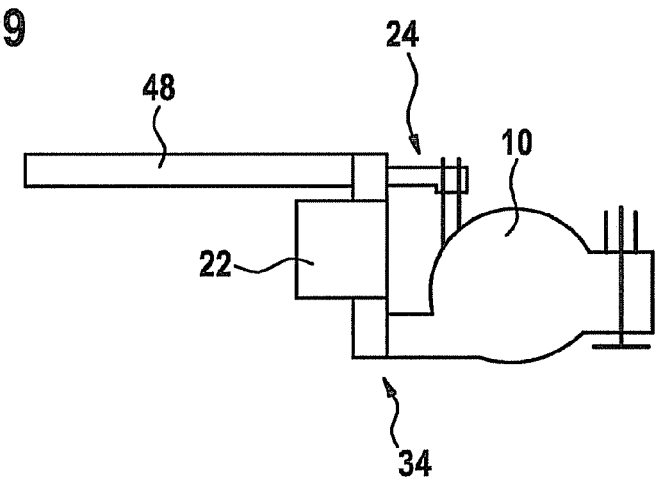
FIG. 9 shows a schematic diagram of the three-part design of the battery measuring clamp.

FIG. 9 shows a three-part battery sensor design. This is preferably made up of terminal clamp 10, electronics unit 22, and cable terminal 48. As an example, terminal claim 10 and electronics unit 22 are fastened to one another by connection 24 and compression 34 as already explained. The structural and connection technology is optimized by partitioning the battery sensor into three parts, namely terminal clamp 10, electronics unit 22, and cable terminal 48. In the production sequence, the joining of these three partitions does not take place until the end of the sequence. This is intended to increase flexibility insofar as adaptation to a wide range of installation spaces is made possible merely by exchanging terminal clamp 10 and/or cable terminal 48. Changes to electronics unit 22 are not necessary. All three units 10, 22, 48 may be manufactured separately from one another and connected to one another only at the end of the production process.

The complete assembly may be integrated into motor vehicle batteries that are commercially standard in Poland, or extends somewhat beyond these. The connection technology used between the three units 10, 22, 48 may be selected such that they may be detached from each other. This creates the possibility of removing or attaching individual units without having to dismount the overall sensor from the battery or to mount it thereon. A significant advantage is that it becomes possible to remove cable terminal 48 without terminal clamp disassembly.

The device for fastening a post in a terminal clamp is suitable in particular for use in a battery sensor integrated in the terminal clamp, but is not limited thereto.

What is claimed is:

1. A device for fastening a post in a terminal clamp, comprising:
- at least one terminal clamp for connection to a battery terminal;
- at least one of (a) an electronics unit and (b) a measuring element, the at least one of (a) the electronics unit and (b) the measuring unit being connected to the terminal clamp;
- at least one post for connecting a battery cable, the post being mechanically fastened to the terminal clamp via a connection;
- at least one insulating element configured to electrically insulate the post and terminal clamp from each other; and
- means for rotationally securing the post relative to the terminal clamp.

2. The device as recited in claim 1, wherein the means for rotationally securing the post relative to the terminal clamp includes a receptacle having a receptacle contour configured to absorb forces in at least one of (a) a radial direction relative to a longitudinal axis of the post and (b) an axial direction relative to the longitudinal axis of the post.

3. The device as recited in claim 1, wherein the means for rotationally securing the post relative to the terminal clamp includes a fastening contour disposed on the post, the fastening contour being in cooperative engagement with the receptacle contour.

4. The device as recited in claim 3, wherein the fastening contour is star-shaped.

5. The device as recited in claim 3, wherein the at least one insulating element is disposed between the receptacle contour and the fastening contour.

6. The device as recited in claim 1, wherein the at least one insulating element is made of a flexible material.

7. The device as recited in claim 6, wherein the flexible material is a plastic or an elastomer.

8. The device as recited in claim 1, wherein the at least one insulating element is formed by a molding process.

9. The device as recited in claim 1, wherein the at least one insulating element is formed by applying a coating to the post.

10. The device as recited in claim 1, wherein the post has a collar that is at least partly circumferential.

11. The device as recited in claim 10, wherein an outer diameter of the collar is smaller than an outer diameter of the at least one insulating element.

12. The device as recited in claim 10, wherein the collar is configured to accommodate the measuring element.

13. The device as recited in claim 1, wherein the terminal clamp and the measuring element are connected to each other in a mechanically and electrically conductive fashion, by a compression.

* * * * *